(12) United States Patent
Asakawa et al.

(10) Patent No.: US 9,444,012 B2
(45) Date of Patent: Sep. 13, 2016

(54) SEMICONDUCTOR LIGHT EMITTING DEVICE AND METHOD FOR MANUFACTURING THE SAME

(75) Inventors: Koji Asakawa, Kanagawa-ken (JP); Akira Fujimoto, Kanagawa-ken (JP); Ryota Kitagawa, Tokyo (JP); Takanobu Kamakura, Kanagawa-ken (JP); Shinji Nunotani, Tokyo (JP); Eishi Tsutsumi, Kanagawa-ken (JP); Masaaki Ogawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 346 days.

(21) Appl. No.: 13/037,990

(22) Filed: Mar. 1, 2011

(65) Prior Publication Data

US 2012/0056155 A1 Mar. 8, 2012

(30) Foreign Application Priority Data

Sep. 6, 2010 (JP) ................................ 2010-199345

(51) Int. Cl.
*H01L 33/00* (2010.01)
*H01L 33/38* (2010.01)
*H01L 33/40* (2010.01)

(52) U.S. Cl.
CPC ............. *H01L 33/38* (2013.01); *H01L 33/405* (2013.01); *H01L 2933/0016* (2013.01)

(58) Field of Classification Search
USPC ....... 257/79, 81, 97–99, 102, 130, 613, 615, 257/745, 762, 768, 918, E33.067, E33.068; 438/22, 26, 29, 46, 47; 315/291; 362/97.1
See application file for complete search history.

(56) References Cited

U.S. PATENT DOCUMENTS

| 6,258,618 B1 | 7/2001 | Lester |
| 6,420,732 B1 * | 7/2002 | Kung et al. ..................... 257/79 |
| 6,565,763 B1 | 5/2003 | Asakawa et al. |

(Continued)

FOREIGN PATENT DOCUMENTS

| JP | 2003-318441 | 11/2003 |
| JP | 2004-055646 | 2/2004 |

(Continued)

OTHER PUBLICATIONS

U.S. Appl. No. 13/037,914, filed Mar. 1, 2011, Kitagawa et al.

(Continued)

*Primary Examiner* — Meiya Li
(74) *Attorney, Agent, or Firm* — Oblon, McClelland, Maier & Neustadt, L.L.P

(57) ABSTRACT

A semiconductor light emitting device includes a structural body, a first electrode layer, and a second electrode layer. The structural body includes a first semiconductor layer of a first conductivity type, a second semiconductor layer of a second conductivity type, and a light emitting layer between the first and second semiconductor layers. The first electrode layer includes a metal portion, plural first opening portions, and at least one second opening portion. The metal portion has a thickness of not less than 10 nanometers and not more than 200 nanometers along a direction from the first semiconductor layer toward the second semiconductor layer. The plural first opening portions each have a circle equivalent diameter of not less than 10 nanometers and not more than 1 micrometer. The at least one second opening portion has a circle equivalent diameter of more than 1 micrometer and not more than 30 micrometers.

13 Claims, 7 Drawing Sheets

(56) References Cited

U.S. PATENT DOCUMENTS

| | | |
|---|---|---|
| 6,998,649 B2 | 2/2006 | Hata |
| 2009/0079322 A1 | 3/2009 | Tsutsumi et al. |
| 2009/0211783 A1 | 8/2009 | Tsutsumi et al. |
| 2009/0236962 A1* | 9/2009 | Fujimoto et al. ............. 313/348 |
| 2009/0242925 A1* | 10/2009 | Kitagawa ................ H01L 33/38 257/99 |
| 2009/0278158 A1* | 11/2009 | Fukunaga ............... H01L 33/42 257/99 |
| 2010/0127635 A1* | 5/2010 | Yao .............................. 315/291 |

FOREIGN PATENT DOCUMENTS

| | | |
|---|---|---|
| JP | 2007-123446 | 5/2007 |
| JP | 2009-130027 | 6/2009 |
| JP | 2009-231689 | 10/2009 |

OTHER PUBLICATIONS

U.S. Appl. No. 12/876,318.

Japanese Office Action issued Jan. 21, 2013, in Japan Patent Application No. 2010-199345 (with English translation).

U.S. Appl. No. 13/221,319, filed Aug. 30, 2011, Masunaga, et al.

U.S. Appl. No. 14/543,942, filed Nov. 18, 2014, Masunago, et al.

Japanese Office Action issued Sep. 18, 2012 in corresponding Japanese Application No. 2010-199345 (with an English Translation).

* cited by examiner

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2010-199345, filed on Sep. 6, 2010; the entire contents of which are incorporated herein by reference.

FIELD

Embodiments described herein relate generally to a semiconductor light emitting device and a method for manufacturing the same.

BACKGROUND

A semiconductor light emitting device includes an electrode in ohmic contact with the surface of a semiconductor layer. The semiconductor light emitting device is caused to emit light by passing a current through this electrode. Here, in illumination apparatuses, for instance, a relatively large light emitting device is desired. In this context, there is considered a semiconductor light emitting device which additionally includes a thin wire electrode extending along the semiconductor layer surface from the pad electrode. Furthermore, in another semiconductor light emitting device under consideration, a metal electrode is provided entirely on the light emitting surface, and ultrafine opening portions on the nanometer (nm) scale are formed in the metal electrode. However, semiconductor light emitting devices are required to achieve higher brightness.

DETAILED DESCRIPTION

Figure 1:
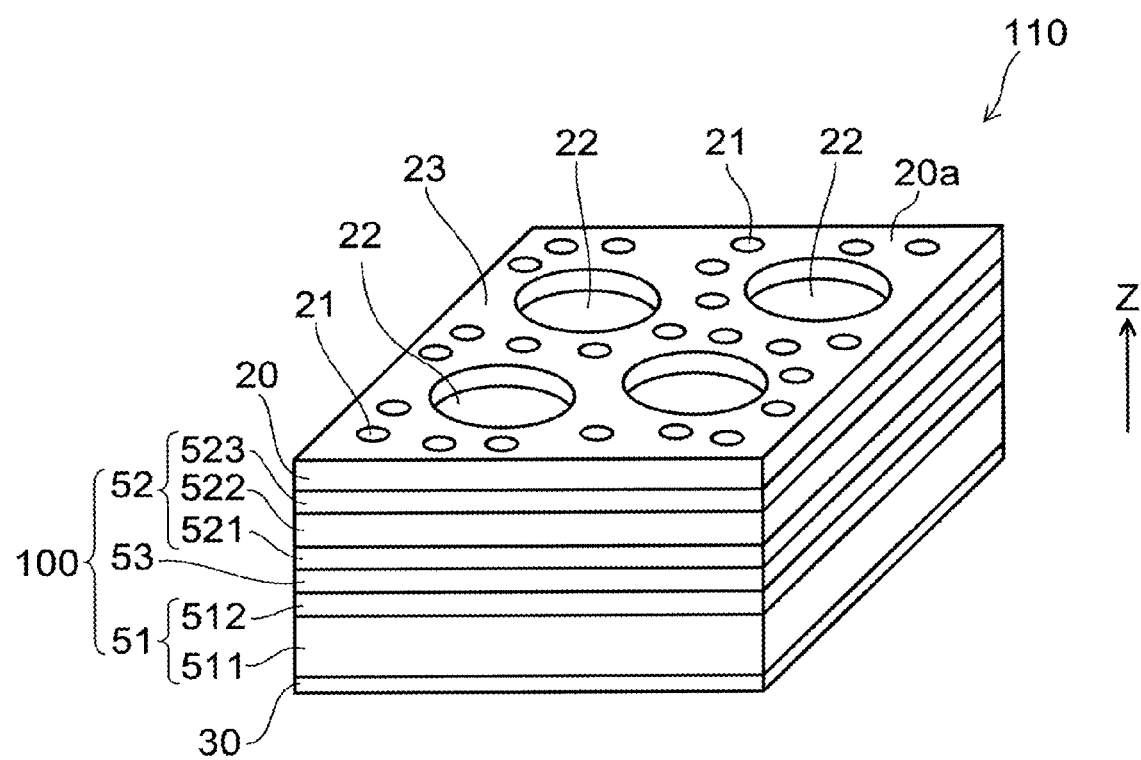
FIG. 1 is a schematic perspective view illustrating the configuration of a semiconductor light emitting device.

In general, according to one embodiment, a semiconductor light emitting device includes a structural body, a first electrode layer, and a second electrode layer. The structural body includes a first semiconductor layer of a first conductivity type, a second semiconductor layer of a second conductivity type, and a light emitting layer provided between the first semiconductor layer and the second semiconductor layer. The first electrode layer is electrically continuous with the second semiconductor layer. The first electrode layer includes a metal portion, a plurality of first opening portions, and a second opening portion. The metal portion has a thickness of not less than 10 nanometers and not more than 200 nanometers along a direction from the first semiconductor layer toward the second semiconductor layer. The plurality of first opening portions penetrate through the metal portion along the direction and each have a circle equivalent diameter of not less than 10 nanometers and not more than 1 micrometer. The second opening portion penetrates through the metal portion along the direction and has a circle equivalent diameter of more than 1 micrometer and not more than 30 micrometers. The second electrode layer is electrically continuous with the first semiconductor layer.

According to another embodiment, a method is disclosed for manufacturing a semiconductor light emitting device. The method can include forming a metal layer on a second semiconductor layer of a structural body. The structural body includes a first semiconductor layer of a first conductivity type, the second semiconductor layer of a second conductivity type, and a light emitting layer provided between the first semiconductor layer and the second semiconductor layer. The method can include forming a resist film on the metal layer. The method can include forming a resist layer including a plurality of first resist apertures and a second resist aperture by irradiating the resist film with electron beam or light and performing development of the resist film. In addition, the method can include forming an electrode layer including a plurality of first opening portions and a second opening portion by etching the metal layer using the resist layer as a mask. The plurality of first opening portions correspond to the plurality of first resist apertures and each have a circle equivalent diameter of not less than 10 nanometers and not more than 1 micrometer. The second opening portion corresponds to the second resist aperture and has a circle equivalent diameter of more than 1 micrometer and not more than 30 micrometers.

Further, a method is disclosed for manufacturing a semiconductor light emitting device. The method can include forming a metal layer on a second semiconductor layer of a structural body. The structural body includes a first semiconductor layer of a first conductivity type, the second semiconductor layer of a second conductivity type, and a light emitting layer provided between the first semiconductor layer and the second semiconductor layer. The method can include forming a resist film on the metal layer. The method can include forming a resist layer including a plurality of first resist recesses and a second resist recess in the resist film by pressing a projection of a stamper including the projection against the resist film. In addition, the method can include forming an electrode layer including a plurality of first opening portions and a second opening portion by etching the metal layer using the resist layer as a mask. The plurality of first opening portions correspond to a plurality of first resist apertures and each have a circle equivalent diameter of not less than 10 nanometers and not more than 1 micrometer. The second opening portion corresponds to the second resist aperture and has a circle equivalent diameter of more than 1 micrometer and not more than 30 micrometers.

For example, embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification of the application and the drawings, the same components as those described previously with reference to earlier figures are labeled with like reference numerals, and the detailed description thereof is omitted as appropriate.

By way of illustration, the following description provides examples with the first conductivity type being n-type and the second conductivity type being p-type.

First Embodiment

FIG. 1 is a schematic perspective view illustrating the configuration of a semiconductor light emitting device according to a first embodiment.

The semiconductor light emitting device 110 according to the first embodiment includes a structural body 100, a first electrode layer 20, and a second electrode layer 30.

The structural body 100 includes a first semiconductor layer 51 of the first conductivity type, a second semiconductor layer 52 of the second conductivity type, and a light emitting layer 53 provided between the first semiconductor layer 51 and the second semiconductor layer 52.

The first semiconductor layer 51 includes a cladding layer 512 made of e.g. n-type InAlP. The cladding layer 512 is formed on a substrate 511 of e.g. n-type GaAs. In the embodiment, for convenience, the substrate 511 is included in the first semiconductor layer 51.

The second semiconductor layer 52 includes a cladding layer 521 made of e.g. p-type InAlP. On the cladding layer 521, a current diffusion layer 522 made of e.g. p-type InGaAlP is provided. A contact layer 523 is provided thereon. In the embodiment, for convenience, the current diffusion layer 522 and the contact layer 523 are included in the second semiconductor layer 52.

The light emitting layer 53 is provided between the first semiconductor layer 51 and the second semiconductor layer 52. In the semiconductor light emitting device 110, for instance, the cladding layer 512 of the first semiconductor layer 51, the light emitting layer 53, and the cladding layer 521 of the second semiconductor layer 52 constitute a heterostructure.

The first electrode layer 20 is provided on a side of the second semiconductor layer 52 opposite to the first semiconductor layer 51. The first electrode layer 20 is made of a material such as Au and Ag as described below, or Au and Ag slightly doped with impurity.

In the embodiment, for convenience of description, the second semiconductor layer 52 side of the structural body 100 is referred to as the front surface side or upper side, and the first semiconductor layer 51 side of the structural body 100 is referred to as the rear surface side or lower side. Furthermore, the stacking direction along the direction from the first semiconductor layer 51 to the second semiconductor layer 52 is referred to as a Z direction.

The first electrode layer 20 includes a metal portion 23, a plurality of first opening portions 21, and a plurality of second opening portions 22. The plurality of first opening portions 21 penetrate through the metal portion 23 along the Z direction. The second opening portions 22 penetrate through the metal portion 23 along the Z direction. Each of the plurality of first opening portions 21 has a circle equivalent diameter of not less than 10 nm and not more than 1 μm. The second opening portion 22 have a circle equivalent diameter of more than 1 μm and not more than 30 μm.

Here, the circle equivalent diameter is defined by the following equation (1).

$$\text{Circle equivalent diameter} = 2 \times (\text{Area}/\pi)^{1/2} \quad (1)$$

where "Area" is the area of the first opening portion 21 or the second opening portion 22 as viewed from the Z direction.

The first opening portions 21 and the second opening portions 22 do not necessarily need to be circular. Hence, in the embodiment, the above definition of the circle equivalent diameter is used to specify the first opening portions 21 and the second opening portions 22. The circle equivalent diameter of the first opening portions 21 is smaller than the circle equivalent diameter of the second opening portions 22. The first opening portions 21 are provided in a plurality, whereas it is only necessary to provide at least one second opening portion 22, although plural second opening portions 22 are shown in FIG. 1.

The second electrode layer 30 is electrically continuous with the first semiconductor layer 51. In this example, the second electrode layer 30 is provided on the rear surface side of the structural body 100. The second electrode layer 30 is made of e.g. Au.

In such a semiconductor light emitting device 110, the surface with the first electrode layer 20 formed thereon is used as a main light emitting surface. That is, in response to application of a prescribed voltage between the first electrode layer 20 and the second electrode layer 30, light having a prescribed center wavelength is emitted from the light emitting layer 53. This light is emitted outside primarily from the major surface 20a of the first electrode layer 20.

In the semiconductor light emitting device 110 according to the first embodiment, the first electrode layer 20 includes a plurality of first opening portions 21 and at least one second opening portion 22. Hence, while maintaining the extent of the current to the light emitting layer 53 caused by the first electrode layer 20 including ultrafine first opening portions 21 having a size on the order of e.g. not less than 10 nm and not more than 1 μm, light can be efficiently emitted outside from the at least one second opening portion 22 having a size on the order of e.g. more than 1 μm and not more than 30 μm. That is, the semiconductor light emitting device 110 can increase the light emission efficiency in the light emitting layer 53 and increase the brightness of the emission light from the first electrode layer 20.

A specific example of the semiconductor light emitting device 110 is described.

The semiconductor light emitting device 110 includes a substrate 511 of e.g. n-type GaAs. A heterostructure is formed on this substrate 511. For instance, the heterostructure includes a cladding layer 512 made of n-type InAlP, a light emitting layer 53 made of InGaP, and a cladding layer 521 made of p-type InAlP.

The light emitting layer 53 may have e.g. a MQW (Multiple Quantum Well) structure in which barrier layers and well layers are alternately and repeatedly provided. Alternatively, the light emitting layer 53 may include a SQW (Single Quantum Well) structure in which a well layer is sandwiched between a pair of barrier layers.

On this light emitting layer 53, a current diffusion layer 522 made of e.g. p-type InGaAlP is formed. Furthermore, the current diffusion layer 522 may be doped with carbon or the like. This decreases the resistance of the current diffusion layer 522 to facilitate ohmic connection with the first electrode layer 20. Here, the above semiconductor layer configuration is illustrative only, and the embodiment is not limited thereto.

On the current diffusion layer 522, a contact layer 523 made of e.g. GaAs is formed. A first electrode layer 20 is formed via the contact layer 523.

Here, the contact layer 523 can be made of a material such as GaAs and GaP. However, the embodiment is not limited thereto. The material used for the contact layer 523 is suitably selected on the basis of, for instance, the material of the current diffusion layer 522 adjacent to the contact layer 523 and the material used for the first electrode layer 20.

The first electrode layer 20 serves as a p-side electrode and is made of e.g. Au/Au—Zn. The first electrode layer 20 includes a plurality of first opening portions 21 penetrating through this metal portion 23 along the Z direction and at least one second opening portion 22 penetrating through the metal portion 23 along the Z direction. The size and layout of each of the first opening portions 21 and the second opening portion 22 may be either regular or irregular.

FIGS. 2A to 2D are schematic plan views illustrating examples of the opening shape of each first opening portion 21 and second opening portion 22.

In FIGS. 2A to 2D, one opening shape of each of the first opening portion 21 and the second opening portion 22 is illustrated.

Figure 2A:
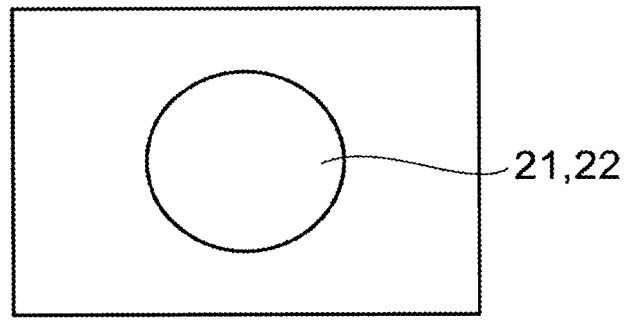
FIGS. 2A to 2D are schematic plan views illustrating opening shapes.
Figure 2B:
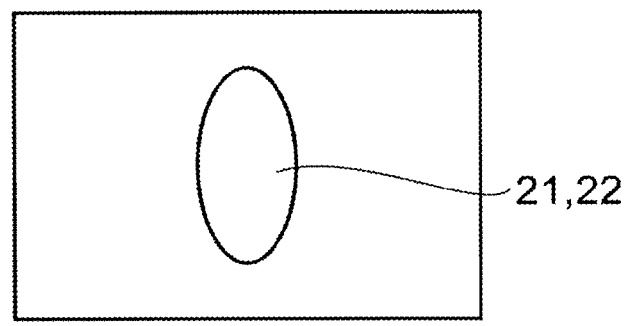
Figure 2C:
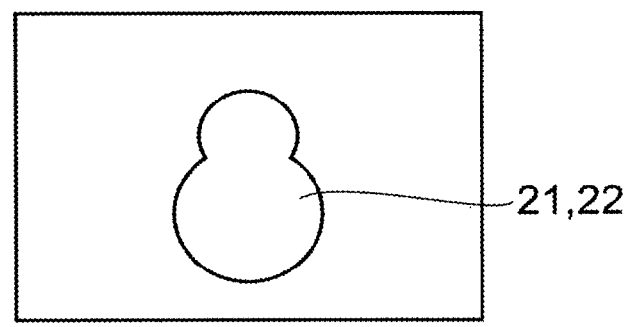
Figure 2D:
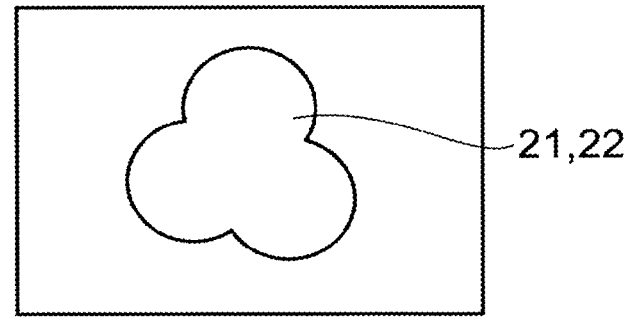

The opening shape illustrated in FIG. 2A is generally circular. The opening shape illustrated in FIG. 2B is generally elliptical. The opening shape illustrated in FIG. 2C is a shape in which two generally circular shapes are connected. The size of the two generally circular shapes may be either different or identical. The opening shape illustrated in FIG. 2D is a shape in which three or more generally circular shapes are connected. The size of the three or more generally circular shapes may be either different or identical.

These opening shapes are illustrative only, and the opening shape is not limited thereto. Furthermore, the opening shape may be a combination of various shapes.

In the following description, by way of example, it is assumed that the opening shape of each first opening portion 21 and the second opening portion 22 is generally circular.

On the rear surface side of the substrate constituting the first semiconductor layer 51, an n-side second electrode layer 30 made of e.g. Au is formed. The second electrode layer 30 is electrically continuous with the first semiconductor layer 51.

In the semiconductor light emitting device 110 according to the embodiment, light emitted from the light emitting layer 53 is emitted outside from the entire surface, provided with the first electrode layer 20, of the second semiconductor layer 52 including the current diffusion layer.

Such a semiconductor light emitting device 110 is used in various equipment. Currently, use of the semiconductor light emitting device 110 in image display apparatuses and illumination apparatuses is under consideration. In such a semiconductor light emitting device 110, basically, electrodes are provided on both sides of the semiconductor layer, and a current is passed between the electrodes to cause light emission.

In a typical semiconductor light emitting device, a current is passed through a pad electrode provided in part of the surface of the semiconductor layer, thereby causing light emission around the pad electrode.

In a semiconductor light emitting device, in order to enlarge the light emitting region, for instance, a thin wire electrode extending along the semiconductor layer surface from the electrode on the pad portion is added to enlarge the area of the light emitting portion. However, the use of thin wire electrodes complicates the electrode structure.

On the other hand, the brightness characteristic with respect to the current of a semiconductor light emitting device has a peak at a certain current value, and the brightness decreases even if a higher current is passed.

One of the causes of the decrease of brightness is that heat is generated by passage of a high current inside the semiconductor light emitting device and cannot be sufficiently dissipated. Thus, to achieve higher brightness in the semiconductor light emitting device, sufficient cooling (heat dissipation) of the semiconductor light emitting device is performed.

In the semiconductor light emitting device 110 according to the embodiment, the first electrode layer 20 includes a plurality of nanometer-scale first opening portions 21 penetrating through the metal portion 23. The first electrode layer 20 including such first opening portions 21 is made of a metal. Hence, as compared with typical semiconductors constituting the current diffusion layer and oxide transparent electrodes made of ITO (Indium Tin Oxide), the electrical conductivity is higher by at least one or two orders of magnitude, and the thermal conductivity is also higher. Thus, in the semiconductor light emitting device 110 assembled therewith, the forward voltage (Vf) is lower than in the case of using ITO. This relaxes current concentration, i.e., local concentration of current in the light emitting layer 53. Thus, the entire light emitting layer 53 emits light more uniformly, and the brightness increases.

On the other hand, because the metal layer constitutes a light emitting surface, part of the light to be emitted outside from the light emitting layer 53 may be reflected inside by the first electrode layer 20. To reduce this light reflection, at least one second opening portion 22 having a size on the order of e.g. more than 1 μm and not more than 30 μm is provided in part of the first electrode layer 20. This can pass the current more uniformly and cause the entire light emitting surface to emit light.

However, if a second opening portion 22 having a size on the order of e.g. more than 1 μm and not more than 30 μm is provided, it becomes difficult to pass the current to the underlying semiconductor layer. Although it also depends on the doping concentration of the underlying semiconductor layer and the like, formation of an excessively large second opening portion 22 or too many second opening portions 22 increases the electrical resistance of the first electrode layer 20 and results in increasing the forward voltage.

Thus, in the semiconductor light emitting device 110 according to the embodiment, the first electrode layer 20 is configured under the following conditions: (1) the circle equivalent diameter of the first opening portions 21 in the first electrode layer 20 is not less than 10 nm and not more than 1 μm; and (2) the circle equivalent diameter of the at least one second opening portion 22 in the first electrode layer 20 is more than 1 μm and not more than 30 μm. In addition, a more preferable condition is that (3) the thickness of the first electrode layer 20 is not less than 10 nm and not more than 200 nm.

The reason for the above condition (1) is described below.

In the semiconductor light emitting device 110, by providing a relatively large first electrode layer 20, high heat dissipation is achieved to suppress the temperature increase of the semiconductor light emitting device 110. Furthermore, the temperature increase of the semiconductor light emitting device 110 is suppressed also by adjusting the sizes (e.g., circle equivalent diameter) of each first opening portion 21 and second opening portion 22 provided in the first electrode layer 20. That is, the forward voltage of the semiconductor light emitting device 110 is decreased. Thus, the series resistance is decreased, and the heat generation itself can be reduced.

To achieve this effect, it is preferable that the current can be passed entirely and uniformly in the second semiconductor layer 52 from the first electrode layer 20 including the first opening portions 21 and the at least one second opening portion 22. To pass a current uniformly in the second semiconductor layer 52, the sizes of each first opening portion 21 and second opening portion 22, and the center spacing of the first opening portions 21 and the at least one second opening portion 22 are limited to some extent.

Although it also depends on the doping concentration of the semiconductor layer passing the current and the like, according to calculations such as simulation, the current flows in the range of approximately 5 μm from the edge of the first electrode layer 20, and the sufficiently conductive range without increase of forward current is not more than 1 μm. That is, if the diameter of the first opening portions 21 is larger than this, a range without current flow occurs. This makes it impossible to decrease the series resistance, and to decrease the forward voltage. Thus, the upper limit of the average aperture diameter of the first opening portion 21 is not more than 1 μm.

By providing the first electrode layer 20 with opening portions sufficiently smaller than the wavelength of light generated from the light emitting layer 53, the first electrode layer 20 may function as a light transmitting electrode despite being made of a metal. In this case, the linear distance of the continuous metal portion not hampered by the opening portion is sufficiently shorter than the wavelength of light. This inhibits the motion of free electrons induced by the electric field of the light irradiating the first electrode layer 20. Thus, the free electrons cannot respond to the light of this wavelength, and hence the metal is made transparent to the light.

The Drude's theory describing metal reflection assumes that the target substance is sufficiently larger than the wavelength of irradiating light and has a uniform structure. The motion of free electrons in the substance irradiated with light having a frequency lower than the plasma frequency can be described as follows. The electric field of light causes polarization of electrons in the substance. This polarization is induced in the direction canceling the electric field of the light. Thus, this induced polarization of electrons shields the electric field of the light. Hence, the light cannot pass through the substance, causing the so-called plasma reflection. Here, if the substance in which the polarization of electrons is induced is sufficiently smaller than the wavelength of light, the motion of electrons is restricted by its geometrical structure. Thus, it is considered that this makes it impossible to shield the electric field of light. In terms of structure, this can be realized by making the diameter of the opening portion sufficiently smaller than the wavelength of the light.

Thus, in order that the effect of light transmittance (transmittance for externally transmitting the light generated by the light emitting layer 53) in the first electrode layer 20 may surpass the effect of aperture ratio (the ratio of the area of the aperture to the area of the first electrode layer 20), it is preferable that the circle equivalent diameter of the first opening portions 21 be approximately not more than ½ of the center wavelength of light generated by the light emitting layer 53. For instance, for visible light, the circle equivalent diameter of the first opening portions 21 is preferably not more than 300 nm.

On the other hand, the lower limit of the circle equivalent diameter of the first opening portions 21 is not restricted from the viewpoint of resistance. However, in terms of manufacturability, the circle equivalent diameter is preferably not less than 10 nm, and more preferably not less than 30 nm.

The reason for the above condition (2) is described below.

As described above, in terms of electrical and thermal characteristics, the semiconductor light emitting device 110 according to the embodiment is significantly improved relative to conventional semiconductor light emitting devices. In particular, the performance of the semiconductor light emitting device 110 is significantly improved in terms of peak brightness in the high current input region. Furthermore, by providing the at least one second opening portion 22 satisfying the above condition (2), the brightness in the low current region can be increased.

The at least one second opening portion 22 does not contribute to electrical and thermal conductivity as much as the first opening portions 21. Hence, each second opening portion 22 is provided in part of the first electrode layer 20 including the first opening portions 21 to increase the light transmittance of the first electrode layer 20.

Here, if the number of second opening portions 22 is small, little decrease of electrical and thermal conductivity is observed in the semiconductor light emitting device 110 as a whole, and the light transmittance increases in proportion to the number of second opening portions 22. Hence, by providing one or more second opening portions 22 in the light emitting surface of the semiconductor light emitting device 110, the effect of increasing the transmittance can be achieved.

Here, the brightness in the low current region actually increases in the case that the area of the second opening portions 22 is not less than 5% of the overall area of the first electrode layer 20 including the first opening portions 21. Too many second opening portions 22 results in decreasing the forward current. Hence, the area of the second opening portions 22 is preferably not more than 50% of the overall area of the first electrode layer 20 including the first opening portions 21.

The reason for the above condition (3) is described below.

In the metal used for the material of the metal portion 23 of the first electrode layer 20, for instance, Ag or Au is preferably used as the base metal. This can suppress the absorption loss. Furthermore, the metal used for the material of the metal portion 23 is preferably at least one material selected from Al, Zn, Zr, Si, Ge, Pt, Rh, Ni, Pd, Cu, Sn, C, Mg, Cr, Te, Se, and Ti, or an alloy thereof. This improves the ohmic property, adhesiveness, and heat resistance. Preferably, the metal used for the material of the metal portion 23 has sufficient electrical and thermal conductivity. However, the embodiment is not limited thereto. Any metal can be used for the metal portion 23.

Here, any two points in the metal portion 23 (the portion where the first opening portions 21 and the second opening portions 22 are not provided) of the first electrode layer 20 are seamlessly continuous with each other, and with at least a current supply source such as a pad electrode. The reason for this is to ensure electrical continuity to keep the resistance low.

Here, in the case that a plurality of current supply sources are provided, each point in the metal portion 23 of the first electrode layer 20 only needs to be continuous with one of the current supply sources.

Furthermore, the metal portion 23 is preferably continuous. This increases uniformity of light emission in the semiconductor light emitting device 110. Furthermore, the sheet resistance of the first electrode layer 20 is preferably not more than 10Ω/□, and more preferably not more than 5Ω/□. With the decrease of sheet resistance, the heat generation of the semiconductor light emitting device 110 decreases. Furthermore, light emission is made more uniform, and the brightness increases more significantly.

To form a metal electrode on the semiconductor layer, a metal layer is formed on the semiconductor layer.

For instance, in a method for forming an electrode for a red light emitting device, a stacked structure of Au/Au—Zn (Zn being a dopant in the case of a p-layer) is formed on the compound semiconductor layer made of GaAs, GaP, or the like. Then, by heat treatment, Zn doping into the metal-semiconductor layer interface may be performed to provide ohmic contact.

Also in the semiconductor light emitting device 110 according to the embodiment, a metal layer is formed similarly, and then the first electrode layer 20 is formed by forming first opening portions 21 and at least one second opening portion 22 using a method described below. Here, if the thickness of the first electrode layer 20 is too thin, the amount of dopant is made small and results in insufficient doping. Consequently, sufficient ohmic contact is not obtained, which may result in increasing the resistance.

Experimental studies have revealed that sufficient ohmic contact is realized when the thickness of the first electrode layer 20 is not less than 10 nm. Furthermore, ohmic property is further improved when the thickness of the first electrode layer 20 is not less than 30 nm. On the other hand, with the increase of the thickness of the first electrode layer 20, the resistance decreases. To ensure the transmittance for light generated by the light emitting layer 53, the thickness of the first electrode layer 20 is preferably not more than 200 nm, and more preferably not more than 50 nm.

Here, in the first electrode layer 20, the reflectance of the metal material in the bulk state (bulk reflectance) for light with the wavelength emitted from the light emitting layer 53 is not less than 70%. This is because if the reflectance for metal reflection is low, the light turns into heat and causes loss. The light reflected as light by the first electrode layer 20 can be reused and extracted by providing a reflective layer (not illustrated) below the light emitting layer 53. This allows the light emitted from the light emitting layer 53 to pass through the first electrode layer 20.

Similar to the semiconductor light emitting device 110 according to the embodiment, by satisfying the above conditions (1) and (2) and preferably satisfying the above condition (3), the increase of light emission efficiency in the light emitting layer 53 and the increase of the brightness of emission light from the first electrode layer 20 are possible.

Next, a method for manufacturing a semiconductor light emitting device is discussed.

The method for manufacturing a semiconductor light emitting device can include the following methods (A) to (D), for instance.

(A) Method Using Electron Beam Writing

One method for forming a first electrode layer including opening portions is a method based on electron beam writing. The method for manufacturing a semiconductor light emitting device using this method includes the following processes.

This manufacturing method includes the processes of: (a1) forming a metal layer on a second semiconductor layer of a structural body including a first semiconductor layer of the first conductivity type, the second semiconductor layer of the second conductivity type, and a light emitting layer provided between the first semiconductor layer and the second semiconductor layer; (a2) forming a resist film on the metal layer; (a3) forming a resist layer including a plurality of first resist apertures and a second resist aperture by electron beam irradiation and development of the resist film; and (a4) forming a first electrode layer including a plurality of first opening portions and a second opening portion by etching the metal layer using the resist layer as a mask.

In the process (a4) of forming the first electrode layer, each of the plurality of first opening portions is formed so as to have a circle equivalent diameter of not less than 10 nm and not more than 1 μm, and the second opening portion in the first electrode layer is formed so as to have a circle equivalent diameter of more than 1 μm and not more than 30 μm.

Specifically, the semiconductor light emitting device is manufactured as follows, for instance.

FIGS. 3A to 3D are schematic cross-sectional views illustrating example processes of the method using electron beam writing.

Figure 3A:
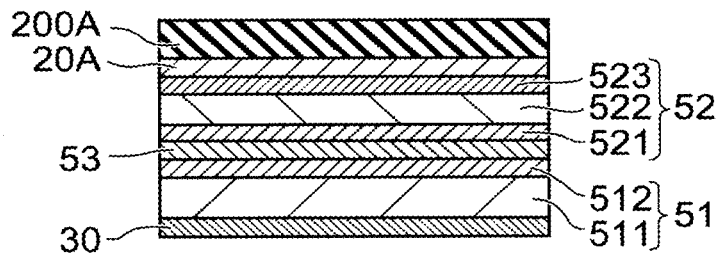
FIGS. 3A to 3D, 4A to 4F, 5A to 5G, and 6A to 6H are schematic cross-sectional views illustrating methods for manufacturing a semiconductor light emitting device.

First, as illustrated in FIG. 3A, a light emitting layer 53 is formed on the first semiconductor layer 51, and a second semiconductor layer 52 is formed thereon. Furthermore, a second electrode layer 30 is formed on the first semiconductor layer 51.

Next, a metal layer 20A is formed on the second semiconductor layer 52. Subsequently, annealing is performed for a prescribed time to provide sufficient ohmic contact between the metal layer 20A and the second semiconductor layer 52. Then, a layer of an electron beam resist film 200A is formed on the metal layer 20A.

Figure 3B:
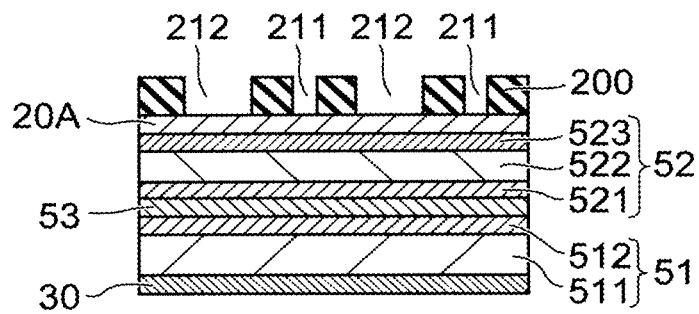

Next, as illustrated in FIG. 3B, by an electron beam exposure system equipped with a pattern generator, first resist apertures 211 corresponding to first opening portions 21 are formed in the resist film 200A. Furthermore, second resist apertures 212 corresponding to second opening portions 22 are formed in the resist film 200A.

Here, the second opening portions 22 in the first electrode layer 20 have a size of approximately several μm and can be well formed by photolithography using an excimer laser or the emission line of a mercury lamp. Numerous photoacid generators such as triphenylsulfonium salts and diphenyliodonium salts used for chemically amplified resists are sensitive to both electron beam and light. Hence, exposure corresponding to the first opening portions 21 can be performed by electron beam writing, and then exposure corresponding to the second opening portions 22 can be performed by ultraviolet exposure. Thus, patterns corresponding to both of them can be formed using the same resist.

Figure 3C:
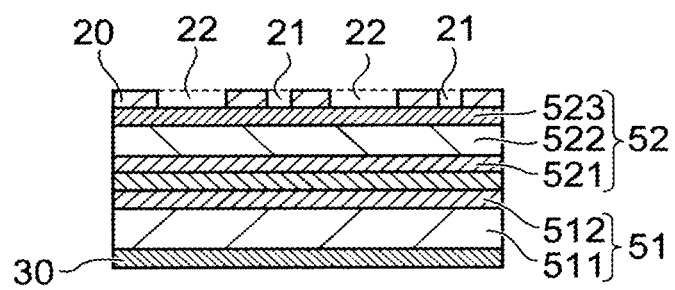

Next, as illustrated in FIG. 3C, an electron beam resist pattern 200 including the first resist apertures 211 and the second resist apertures 212 is used as a mask to perform ion milling to etch the metal layer 20A. Thus, first opening portions 21 are formed in the metal layer 20A corresponding to the first resist apertures 211, and a second opening portions 22 are formed in the metal layer 20A corresponding to the second resist aperture 212. The metal layer 20A is provided with the first opening portions 21 and the second opening portion 22 and constitutes a first electrode layer 20. After the etching of the metal layer 20A, the resist pattern 200 is removed.

Figure 3D:
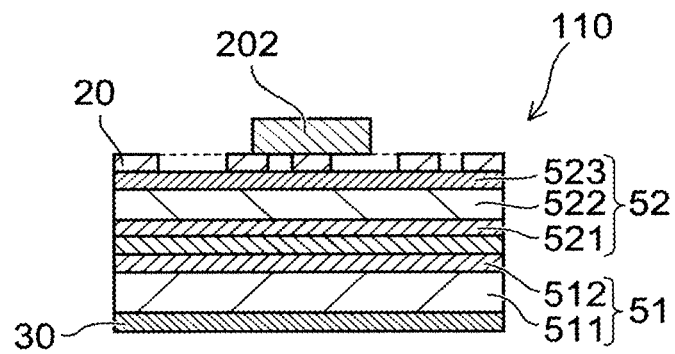

Finally, as illustrated in FIG. 3D, a pad electrode 202 is formed to complete a semiconductor light emitting device 110.

(B) Method Using a Stamper

One other method for manufacturing a semiconductor light emitting device uses a stamper. The method includes the following processes.

This manufacturing method includes the processes of: (b1) forming a metal layer on a second semiconductor layer of a structural body including a first semiconductor layer of the first conductivity type, the second semiconductor layer of the second conductivity type, and a light emitting layer provided between the first semiconductor layer and the second semiconductor layer; (b2) forming a resist film on the metal layer; (b3) forming a resist layer including a plurality of first resist recesses and a second resist recess in the resist film by pressing projections of a stamper including the projections against the resist film; and (b4) forming a first electrode layer including a plurality of first opening portions corresponding to the plurality of first resist recesses and a second opening portion corresponding to the second resist recess by etching the metal layer using the resist layer as a mask.

In the process (b4) of forming the first electrode layer, each of the plurality of first opening portions is formed so as to have a circle equivalent diameter of not less than 10 nm and not more than 1 μm, and each second opening portion in the first electrode layer is formed so as to have a circle equivalent diameter of more than 1 μm and not more than 30 μm.

Specifically, the semiconductor light emitting device can be obtained as follows, for instance.

FIGS. 4A to 4F are schematic cross-sectional views illustrating example processes of the method using a stamper.

Figure 4A:
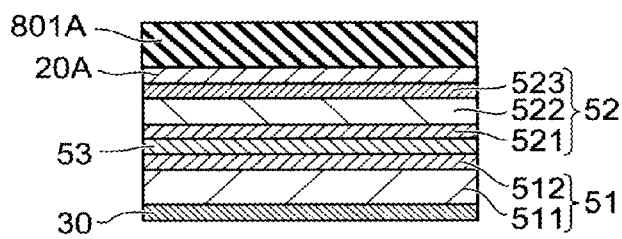

First, as illustrated in FIG. 4A, a light emitting layer 53 is formed on the first semiconductor layer 51, and a second semiconductor layer 52 is formed thereon. Furthermore, a second electrode layer 30 is formed on the first semiconductor layer 51.

Next, a metal layer 20A is formed on the second semiconductor layer 52. Subsequently, annealing is performed for a prescribed time to provide sufficient ohmic contact between the metal layer 20A and the second semiconductor layer 52. Then, a layer of resist film 801A is formed on the metal layer 20A.

Figure 4E:
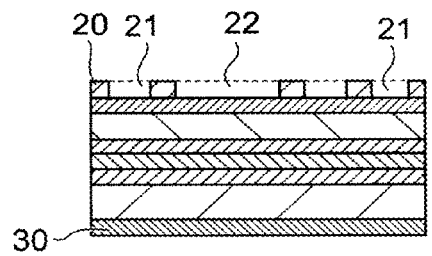
Figure 4B:
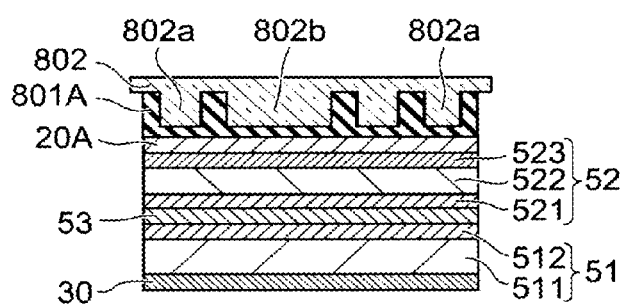

Next, as illustrated in FIG. 4B, a stamper 802 including first projections 802a and a second projection 802b is prepared.

For instance, on the transfer surface including the first projections 802a and the second projection 802b of the stamper 802, a plurality of first projections 802a are provided. The plurality of first projections 802a are discontinuous.

The stamper 802 can be manufactured by forming a desired structure on e.g. quartz by electron beam lithography. Here, the material of the stamper 802 and the method for forming the fine recess and projection structure of the stamper 802 are not limited thereto. For instance, the stamper 802 can also be formed by a method using self-assembly of block copolymer and a method using a fine particle mask described below.

Next, with the resist film 801A heated to a prescribed temperature as needed, as illustrated in FIG. 4B, imprint is performed in which the side of the stamper 802 including projections is pressed against the resist film 801A. After the imprint, the resist film 801A is cured by cooling to room temperature, and the stamper 802 is released. Thus, as illustrated in FIG. 4C, a resist pattern 801B including depressions corresponding to the first projections 802a and the second projection 802b is formed.

Figure 4F:
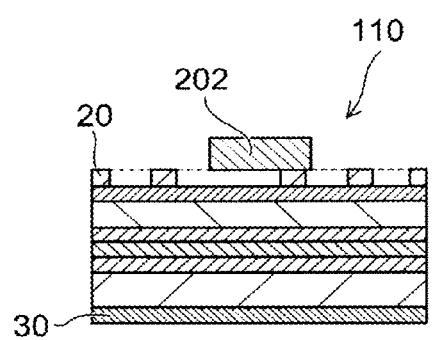
Figure 4C:
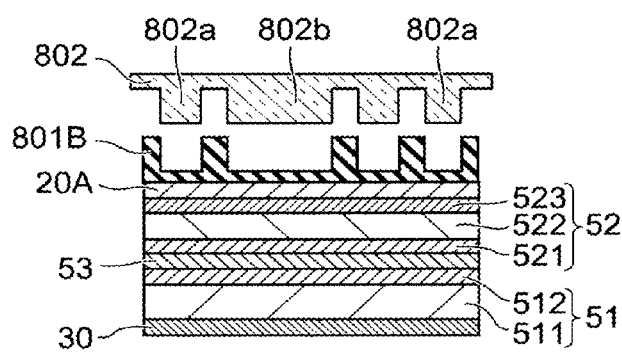
Figure 4D:
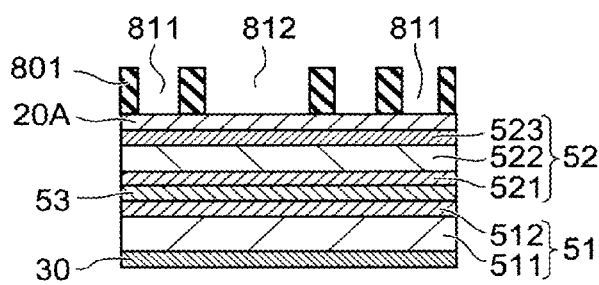

Next, as illustrated in FIG. 4D, the resist pattern 801B is etched. Thus, the bottom of the recess of the resist pattern 801B is removed, and the metal layer 20A is exposed. The portions where the metal layer 20A is exposed constitute first resist apertures 811 and a second resist aperture 812.

Next, as illustrated in FIG. 4E, a resist layer 801 including the first resist apertures 811 and the second resist aperture 812 is used as a mask to perform ion milling to etch the metal layer 20A. Thus, first opening portions 21 are formed in the metal layer 20A corresponding to the first resist apertures 811, and a second opening portion 22 is formed in the metal layer 20A corresponding to the second resist aperture 812. The metal layer 20A is provided with the first opening portions 21 and the second opening portion 22 and constitutes a first electrode layer 20. After the etching of the metal layer 20A, the resist layer 801 is removed.

Finally, as illustrated in FIG. 4F, a pad electrode 202 is formed to complete a semiconductor light emitting device 110.

Here, the method using a stamper is not limited to the thermal shaping as described above. It is possible to use various techniques such as shaping by curing a resist by light irradiation, and shaping using a flexible stamper made of e.g. PDMA (polydimethylacrylamide) or PDMS (polydimethylsiloxane).

(C) Method Using Self-Assembly of Block Copolymer

One other method for manufacturing a semiconductor light emitting device uses phase separation by self-assembly of block copolymer. The method includes the following processes.

This manufacturing method includes the processes of: (c1) forming a metal layer on a second semiconductor layer of a structural body including a first semiconductor layer of the first conductivity type, the second semiconductor layer of the second conductivity type, and a light emitting layer provided between the first semiconductor layer and the second semiconductor layer; (c2) generating a microdomain pattern by applying a composition including a block copolymer to at least part of the surface of the metal layer and phase-separating the block copolymer; and (c3) forming a first electrode layer including a plurality of first opening portions and a second opening portion by etching the metal layer using the microdomain pattern as a mask.

In the process (c3) of forming the first electrode layer, each of the plurality of first opening portions is formed so as to have a circle equivalent diameter of not less than 10 nm and not more than 1 micrometer (μm), and the second opening portion in the first electrode layer is formed so as to have a circle equivalent diameter of more than 1 μm and not more than 30 μm.

Specifically, the semiconductor light emitting device can be obtained as follows, for instance.

FIGS. 5A to 5G are schematic cross-sectional views illustrating example processes of the method using self-assembly of block copolymer.

Figure 5A:
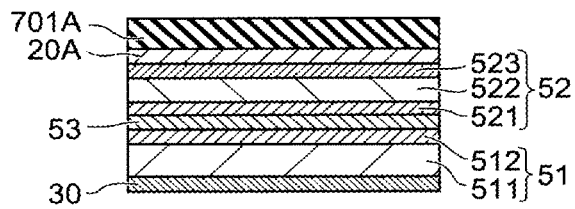

First, as illustrated in FIG. 5A, a light emitting layer 53 is formed on the first semiconductor layer 51, and a second semiconductor layer 52 is formed thereon. Furthermore, a second electrode layer 30 is formed on the first semiconductor layer 51.

Next, a metal layer 20A is formed thereon. Subsequently, annealing is performed for a prescribed time to provide sufficient ohmic contact between the metal layer 20A and the second semiconductor layer 52. Then, a silicon oxide film 701A, for instance, is formed on the metal layer 20A.

Figure 5E:
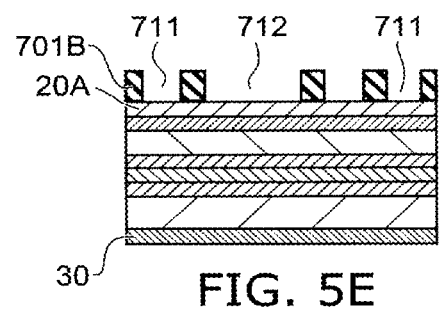
Figure 5B:
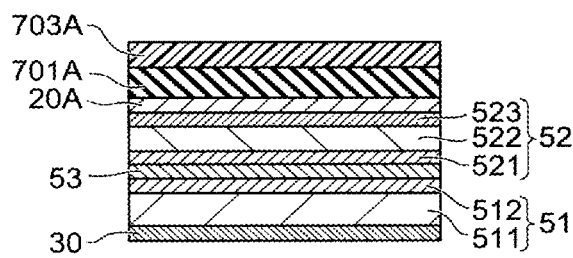

Next, as illustrated in FIG. 5B, a liquid in which a block copolymer including two types of polymer blocks is dissolved in a solvent is applied onto the silicon oxide film 701A by the spin coating method. Subsequently, the solvent is removed by pre-baking to form a block copolymer film 703A. Then, the film is annealed for phase separation of two types of polymers. Thus, as illustrated in FIG. 5C, a microdomain pattern 703 made of one type of polymer is formed.

Next, the microdomain pattern 703 is etched by e.g. an RIE (reactive ion etching) system. At this time, due to the etching rate difference between the two types of polymers, a hole pattern is formed from the polymer having a higher etching rate.

Figure 5F:
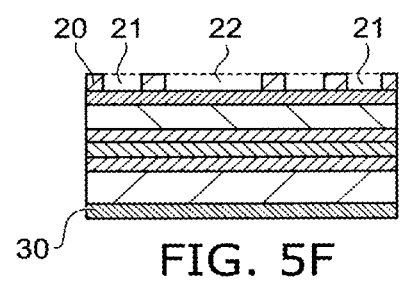
Figure 5C:
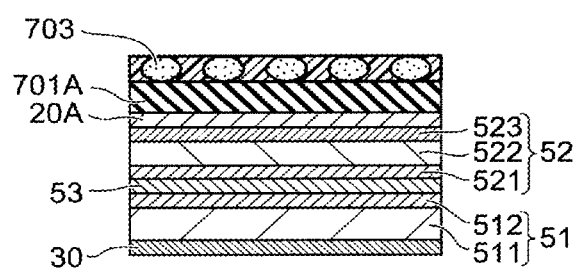
Figure 5G:
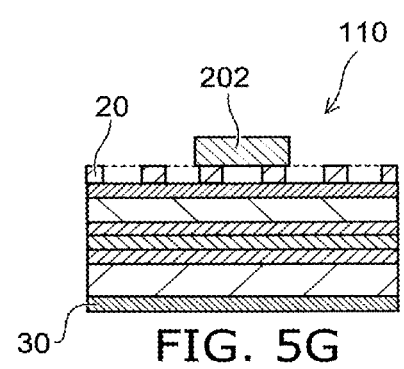
Figure 5D:
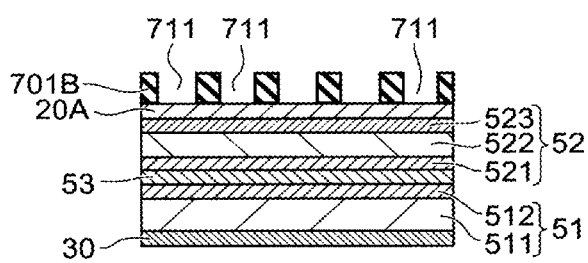

Next, as illustrated in FIG. 5D, the polymer hole pattern is used as a mask to etch the silicon oxide film 701A by e.g. the RIE system to form an oxide film hole pattern 701B. Thus, a first aperture pattern 711 corresponding to first opening portions 21 is formed in the oxide film hole pattern 701B.

Next, a resist film is applied onto the oxide film hole pattern 701B. Then, for instance, a parallel exposure system is used to perform exposure and development of the resist to form a resist pattern including an aperture corresponding to a second opening portion 22. Subsequently, this resist pattern is used as a mask to etch the oxide film hole pattern 701B. Thus, as illustrated in FIG. 5E, a second aperture pattern 712 corresponding to the second opening portion 22 is formed in the oxide film hole pattern 701B.

Next, as illustrated in FIG. 5F, the oxide film hole pattern 701B is used as a mask to perform ion milling to etch the metal layer 20A. Thus, first opening portions 21 are formed in the metal layer 20A corresponding to the first aperture pattern 711, and a second opening portion 22 is formed in the metal layer 20A corresponding to the second aperture pattern 712. The metal layer 20A is provided with the first opening portions 21 and the second opening portion 22 and constitutes a first electrode layer 20. After the etching of the metal layer 20A, the oxide film hole pattern 701B is removed.

Finally, as illustrated in FIG. 5G, a pad electrode 202 is formed to complete a semiconductor light emitting device 110.

(D) Method Using a Mask of Fine Particles

In one other method for manufacturing a semiconductor light emitting device, a monomolecular layer of fine particles made of silica, or the like is used as a mask. The method includes the following processes.

This manufacturing method includes the processes of: (d1) forming a metal layer on a second semiconductor layer of a structural body including a first semiconductor layer of the first conductivity type, the second semiconductor layer of the second conductivity type, and a light emitting layer provided between the first semiconductor layer and the second semiconductor layer; (d2) forming a resist film on the metal layer; (d3) forming a monomolecular layer of fine particles on the surface of the resist film; (d4) forming a resist layer including apertures by etching the resist film using the monomolecular layer as a mask; (d5) forming a reverse pattern mask by filling the apertures of the resist layer with an inorganic substance; and (d6) forming a first electrode layer including a plurality of first opening portions and a second opening portion by etching the metal layer using the reverse pattern mask as a mask.

In the process (d6) of forming the first electrode layer, each of the plurality of first opening portions is formed so as to have a circle equivalent diameter of not less than 10 nm and not more than 1 micrometer (μm), and the second opening portion in the first electrode layer is formed so as to have a circle equivalent diameter of more than 1 μm and not more than 30 μm.

Specifically, the semiconductor light emitting device can be obtained as follows, for instance.

FIGS. 6A to 6H are schematic cross-sectional views illustrating example processes of the method using a mask of fine particles.

Figure 6A:
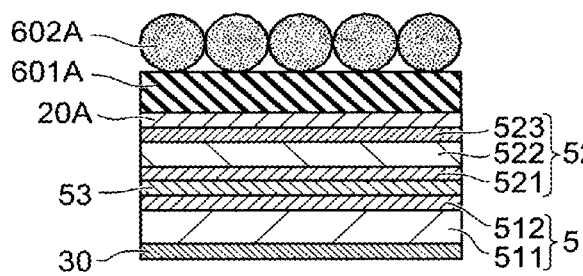

First, as illustrated in FIG. 6A, a light emitting layer 53 is formed on the first semiconductor layer 51, and a second semiconductor layer 52 is formed thereon. Furthermore, a second electrode layer 30 is formed on the first semiconductor layer 51.

Next, a metal layer 20A is formed thereon. Subsequently, annealing is performed for a prescribed time to provide sufficient ohmic contact between the metal layer 20A and the second semiconductor layer 52. Then, a layer of resist film 601A is formed on the metal layer 20A.

Next, a dispersion liquid is prepared by adding a monomer to a liquid in which fine particles are dispersed in e.g. ethyl lactate. The dispersion liquid is dropped onto the above resist film 601A and subjected to spin coating. After the spin coating, the solvent is removed, and annealing is performed. Thus, a monomolecular layer of regularly arranged fine particles 602A is formed.

Figure 6E:
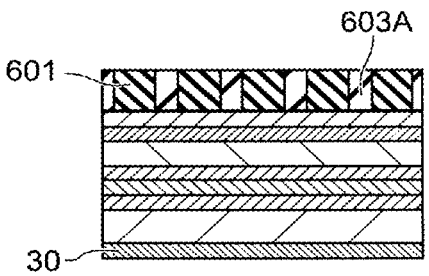
Figure 6B:
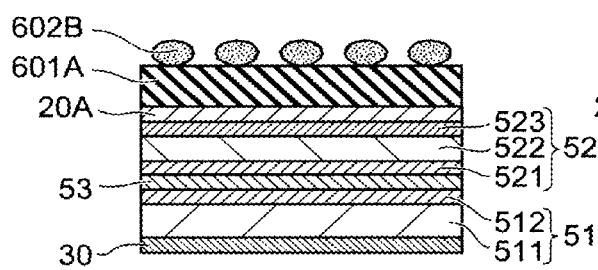

Next, as illustrated in FIG. 6B, the layer of arranged fine particles 602A is etched by an RIE system to reduce the particle diameter of the fine particle. A gap is produced between the reduced fine particles 602B.

Figure 6F:
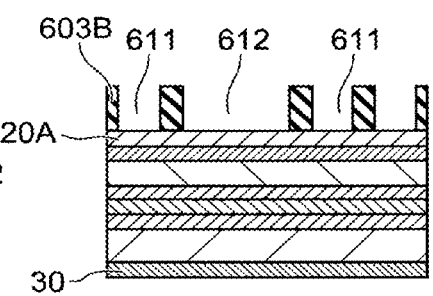
Figure 6C:
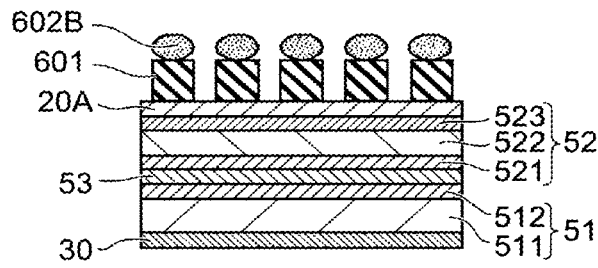

Next, as illustrated in FIG. 6C, the layer of fine particles 602B is used as a mask to etch the resist film 601A to form a resist pillar pattern 601.

Figure 6G:
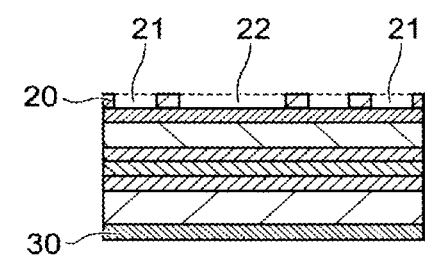
Figure 6D:
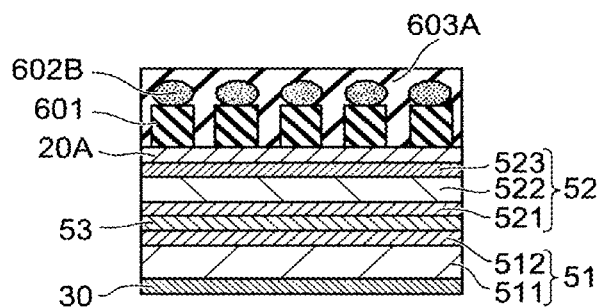

Next, as illustrated in FIG. 6D, an organic SOG composition, for instance, is dropped onto the resist pillar pattern 601 and subjected to spin coating. After the spin coating, the solvent is completely removed, and annealing is performed. After curing the organic SOG composition, the resist pillar pattern 601 is in the state of being buried by a SOG layer 603A. The surface of the SOG layer 603A is flat.

Next, as illustrated in FIG. 6E, the SOG layer 603A is etched back to expose the resist pillar pattern 601. Next, the resist pillar pattern 601 is completely removed by etching. As the result of removing the resist pillar pattern 601, as illustrated in FIG. 6F, a SOG hole pattern 603B is formed. The apertures of this hole pattern 603B constitute a first aperture pattern 611 corresponding to first opening portions 21.

Next, a resist film is applied onto the SOG hole pattern 603B. Then, for instance, a parallel exposure system is used to perform exposure and development of the resist film to form a resist pattern including an aperture corresponding to a second opening portion 22. Subsequently, this resist pattern is used as a mask to etch the SOG hole pattern 603B. Thus, a second aperture pattern 612 corresponding to the second opening portion 22 is formed in the SOG hole pattern 603B.

Next, as illustrated in FIG. 6G, the SOG hole pattern 603B is used as a mask to perform ion milling to etch the metal layer 20A. Thus, first opening portions 21 are formed in the metal layer 20A corresponding to the first aperture pattern 611, and a second opening portion 22 is formed in the metal layer 20A corresponding to the second aperture pattern 612. The metal layer 20A is provided with the first opening portions 21 and the second opening portion 22 and constitutes a first electrode layer 20. After the etching of the metal layer 20A, the SOG hole pattern 603B is removed.

Figure 6H:
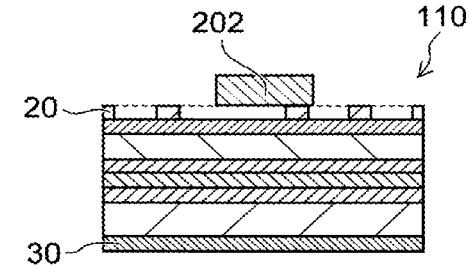

Finally, as illustrated in FIG. 6H, a pad electrode 202 is formed to complete a semiconductor light emitting device 110.

The above manufacturing methods (A) to (D) are illustrative only, and the manufacturing methods are not limited thereto.

Next, practical examples are described. The materials, numerical values, and manufacturing conditions indicated in the following practical examples are illustrative only, and the invention is not limited thereto.

Practical Example 1

In the practical example 1, a semiconductor light emitting device 111 is manufactured pursuant to the above method (A) using electron beam writing.

First, on a substrate 511 of n-type GaAs, a heterostructure including a cladding layer 512 of n-type InAlP, a light emitting layer 53 of InGaP, and a cladding layer 521 of p-type InAlP is formed. A quaternary current diffusion layer 522 of p-type InGaAlP is epitaxially grown thereon.

Next, on a contact layer 523 of p-type GaAs, a metal layer 20A made of Au (10 nm)/Au—Zn (3%) (30 nm) is formed by the evaporation method. Subsequently, annealing is performed in a nitrogen atmosphere at 450° C. for 30 minutes to provide ohmic contact between the metal layer 20A and the contact layer 523.

Next, on the Au/Au—Zn layer, a layer of electron beam resist (manufactured by Fujifilm Corporation under the trade name of FEP-301) is formed to a thickness of 300 nm. Then, by an electron beam exposure system having an acceleration voltage of 50 kV equipped with a pattern generator, a hole pattern (first resist apertures 202a) having an aperture diameter of 100 nm and a spacing of 150 nm is formed in the electron beam resist.

Furthermore, a pattern of holes with a diameter of 3 μm and a spacing of 6 μm is overstruck to form a hole pattern (second resist apertures 202b). Here, because the second resist aperture 202b has a large dimension, this may be performed by photolithography.

Next, by using an ion milling system, the Au/Au—Zn layer is etched for 90 seconds under the condition of an acceleration voltage of 500 volts (V) and an ion current of 40 milliamperes (mA) to form apertures. Thus, a first electrode layer 20 including first opening portions 21 and second opening portions 22 is formed.

After the etching of the Au/Au—Zn layer, oxygen ashing is performed to remove the electron beam resist. Finally, a pad electrode 202 is formed to complete the semiconductor light emitting device 111.

Practical Example 2

In the practical example 2, a semiconductor light emitting device 112 is manufactured pursuant to the above method (C) using self-assembly of block copolymer.

First, similar to the practical example 1, on a substrate 511 of n-type GaAs, a heterostructure including a cladding layer 512 of n-type InAlP, a light emitting layer 53 of InGaP, and a cladding layer 521 of p-type InAlP is formed. A quaternary current diffusion layer 522 of p-type InGaAlP is epitaxially grown thereon.

Next, on a contact layer 523 of p-type GaAs, a metal layer 20A made of Au (10 nm)/Au—Zn (3%) (30 nm) is formed by the evaporation method. Subsequently, annealing is performed in a nitrogen atmosphere at 450° C. for 30 minutes to provide ohmic contact between the metal layer 20A and the contact layer 523. Next, a silicon oxide film is formed to a thickness of 50 nm by CVD.

As a block copolymer, the block copolymer (PS-b-PMMA) of polystyrene (PS) and polymethyl methacrylate (PMMA) is used. The molecular weight (Mn) of the block copolymer is 920 kg/mol, and the composition ratio of PS to PMMA is 80 mol:20 mol. Here, besides PS-b-PMMA, for instance, the block copolymer disclosed in Japanese Patent No. 3940546 may be used to produce a microdomain pattern. PS-b-PMMA is dissolved in propylene glycol monomethyl ether acetate (PGMEA) to provide a block copolymer resist.

Next, the block copolymer resist is applied onto the silicon oxide film by spin coating, and annealed at 230° C. in a non-oxidation oven. Thus, PMMA spherical domains having a diameter of 120 nm are formed in the block copolymer. The film thickness of the PS-b-PMMA block copolymer is adjusted so that the PMMA spherical domains form a single layer.

PMMA is not resistant to RIE. Hence, the block copolymer resist is selectively stripped by oxygen RIE. Thus, the portion of the PMMA domains is removed. Then, the PS portion left like a mesh is used as a mask to perform RIE with a mixed gas of $CF_4$ and Ar, and then ashing is performed with oxygen. Thus, an oxide film mask (oxide film hole pattern 701B) including a first aperture pattern 711 corresponding to first opening portions 21 is formed.

Furthermore, a g-line resist is applied onto this oxide film mask. Here, the first aperture pattern 711 has already been provided in the oxide film mask, and the aperture pattern to be subsequently formed is larger. Hence, it is preferable that the g-line resist is a thick film resist. However, it is also possible to use other photoresists.

Next, for instance, a parallel exposure system is used to perform exposure and development through the mask. Thus, a hole pattern corresponding to second opening portions 22 is formed in the g-line resist. Subsequently, RIE with $CF_4$ is performed to pattern the oxide film mask. Thus, a second aperture pattern 712 is formed in the oxide film mask including the first aperture pattern 711. That is, an oxide film mask is obtained in which the first aperture pattern 711 having a size on the order of e.g. not less than 10 nm and not more than 1 μm coexists with the second aperture pattern 712 having a size on the order of e.g. more than 1 μm and not more than 30 μm.

Next, through the oxide film mask, milling is performed on the Au/Au—Zn layer with argon. Thus, a metallic, light transmissive thin film electrode (first electrode layer 20) including a plurality of first opening portions 21 and a second opening portion 22 is formed.

After the etching of the Au/Au—Zn layer, the oxide film mask is removed. Finally, a pad electrode 202 is formed to complete the semiconductor light emitting device 112.

Comparative Examples

For purposes of comparison, a semiconductor light emitting device 191 is formed by forming only a circular pad electrode on the p-type GaAs contact layer (Comparative example 1).

Furthermore, another semiconductor light emitting device 192 is produced by forming only the first opening portions 21 without forming the second opening portion 22 (Comparative example 2).

The semiconductor light emitting devices 111, 112, 191, and 192 are each diced into a chip 300 μm square. The characteristics of the semiconductor light emitting devices 111, 112, 191, and 192 are compared in the bare chip state.

Figure 7:
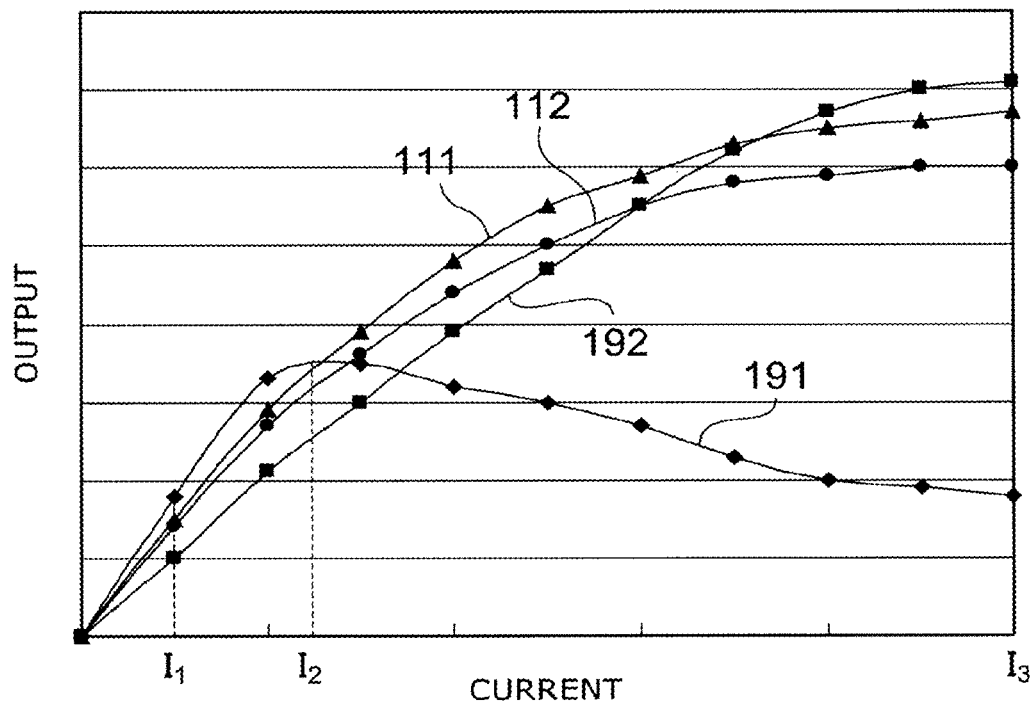
FIG. 7 is a graph illustrating an example of the characteristics of semiconductor light emitting devices.

FIG. 7 is a graph illustrating an example of the characteristics of the practical examples and the comparative examples.

In this figure, the horizontal axis represents current, and the vertical axis represents output.

In the low voltage region, the voltage value for the same current value in the semiconductor light emitting devices 111, 112, and 192 including opening portions (first opening portions 21 and/or second opening portions 22) is lower than that in the semiconductor light emitting device 191 not including opening portions (not including either of first opening portions 21 and second opening portions 22).

However, when the current increases and exceeds a current value $I_2$, the output decreases in the semiconductor light emitting device 191. This results in significantly decreasing the brightness.

In contrast, in the semiconductor light emitting devices 111, 112, and 192, no decrease of output occurs even when the current exceeds the current value $I_2$ and reaches a current value $I_3$.

This is attributed to the improved heat dissipation in the semiconductor light emitting devices 111, 112, and 192 by providing the first electrode layer 20 entirely on the second semiconductor layer 52.

Here, in the semiconductor light emitting device 192, although the output at the current value $I_3$ is highest, the output decrease in the low current region is largest. For instance, at the current value $I_1$, the output of the semiconductor light emitting device 192 is approximately half the output of the semiconductor light emitting device 191.

In contrast, in the low current region, the output of the semiconductor light emitting devices 111 and 112 of the practical examples 1 and 2 remains comparable to the output of the semiconductor light emitting device 191.

Furthermore, in the high current region, the output remains comparable to that of the semiconductor light emitting device 192.

It turns out from the foregoing that the semiconductor light emitting devices 111 and 112 exhibit very good light emission characteristics from the low current region to the high current region. Such light emission characteristics are advantageous to a large chip structure such as 1 mm square, i.e., in the case that the first electrode layer 20 has an outline area of not less than 1 mm$^2$ and in the case that a high current is passed.

Although it also depends on the area of the first electrode layer 20, typically, at a current value of not less than 100 mA, the effect of the semiconductor light emitting devices 111 and 112 is significant.

(Variation)

Figure 8:
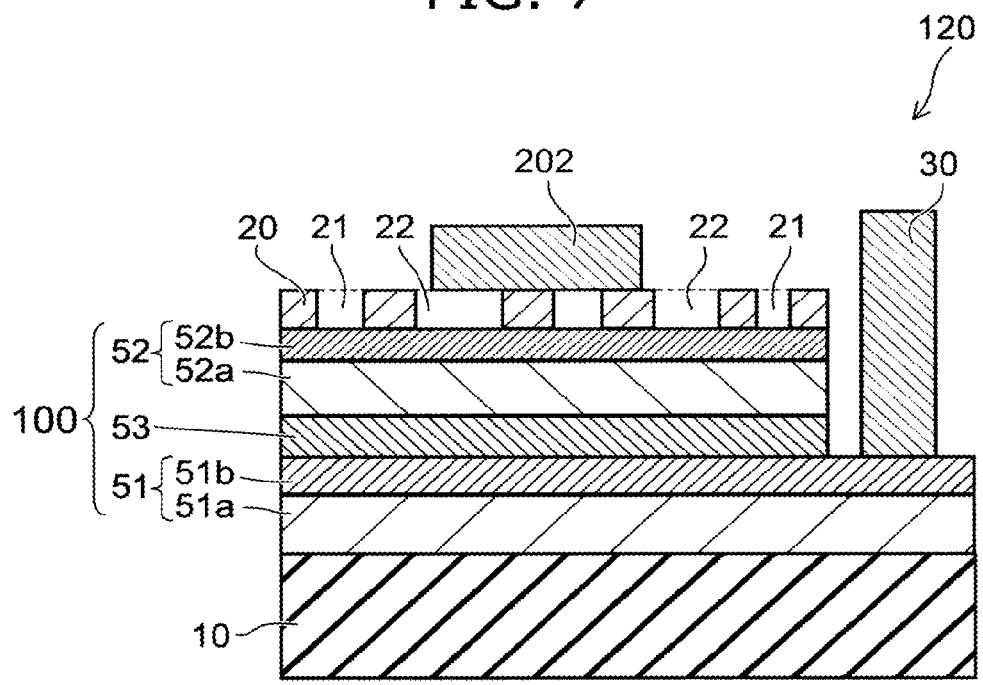
FIG. 8 is a schematic cross-sectional view illustrating a variation of a semiconductor light emitting device.

FIG. 8 is a schematic cross-sectional view illustrating a semiconductor light emitting device according to a variation.

In the semiconductor light emitting device 120 according to this variation, the material of the structural body 100 is a nitride semiconductor.

More specifically, in the semiconductor light emitting device 120, on a growth substrate 10 such as a sapphire substrate, for instance, a GaN buffer layer 51a, a Si-doped n-type GaN layer 51b, a light emitting layer 53 having a MQW (Multiple Quantum Well) structure of InGaN/GaN, a Mg-doped p-type $Al_{0.2}Ga_{0.8}N$ layer 52a, and a Mg-doped p-type GaN layer 52b are formed by e.g. epitaxial growth.

In the semiconductor light emitting device 120 according to this variation, for convenience, the GaN buffer layer 51a and the n-type GaN layer 51b are included in the first semiconductor layer 51, and the p-type $Al_{0.2}Ga_{0.8}N$ layer 52a and the p-type GaN layer 52b are included in the second semiconductor layer 52.

On the p-type GaN layer 52b, a first electrode layer 20 including first opening portions 21 and second opening portions 22 is provided. Furthermore, the p-type GaN layer 52b, the p-type $Al_{0.2}Ga_{0.8}N$ layer 52a, and the light emitting layer 53 are partly etched. On the exposed portion of the n-type GaN layer 51b, a second electrode layer 30 is provided.

In such a semiconductor light emitting device 120, the material of the structural body 100 may be a nitride semiconductor. Furthermore, the second electrode layer 30 is not limited to being provided on the rear surface side of the first semiconductor layer 51, but may be provided on the front surface side of the first semiconductor layer 51.

Also in the semiconductor light emitting device 120 according to this variation, similar to the semiconductor light emitting device 110, light can be efficiently emitted outside while maintaining the extent of the current to the light emitting layer 53 caused by the first electrode layer 20.

The embodiments have been described above. However, the invention is not limited to the above examples. For instance, the second electrode layer 30 provided on the rear surface side or front surface side of the stacked body 100 may include a plurality of first opening portions 21 and a second opening portion 22 similar to the first electrode layer 20. While the first conductivity type is n-type and the second conductivity type is p-type in the above description, the invention can be practiced also in the case where the first conductivity type is p-type and the second conductivity type is n-type.

As described above, in the semiconductor light emitting device and the method for manufacturing the same according to the embodiments, the light emission efficiency (light extraction efficiency) can be increased while maintaining the extent of uniform current to the semiconductor layer caused by the first electrode layer 20 including first opening portions 21 and at least one of second opening portions 22.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device comprising:
   a structural body including a first semiconductor layer of a first conductivity type, a second semiconductor layer of a second conductivity type, and a light emitting layer provided between the first semiconductor layer and the second semiconductor layer, the light emitting layer being made of inorganic semiconductor;
   a first electrode layer electrically continuous with the second semiconductor layer, the first electrode layer including:
      a metal portion having a thickness of not less than 10 nanometers and not more than 200 nanometers along a direction from the first semiconductor layer toward the second semiconductor layer,
      a plurality of first opening portions, at least one of the first opening portions penetrating through the metal portion along the direction, the at least one of the first opening portions having a first circle equivalent diameter of not less than 10 nanometers and not more than 300 nanometers and not more than ½ of a center wavelength of light generated by the light emitting layer, the first circle equivalent diameter being defined by equation: the first circle equivalent diameter=2×(first Area/π)$^{1/2}$, in which the first Area is an area of the at least one of the first opening portions viewed in the direction, and at least one second opening portion penetrating through the metal portion along the direction, the at least one second opening portion having a second circle equivalent diameter of more than 1 micrometer and not more than 30 micrometers, the second circle equivalent diameter being defined by equation: the second circle equivalent diameter=2×(second Area/π)$^{1/2}$, in which the second Area is an area of the at least one second opening portion viewed in the direction, a total area of the second opening portion as viewed from the direction is not less than 5% and not more than 50% of an overall area of the first electrode layer as viewed from the direction; and a second electrode layer electrically continuous with the first semiconductor layer, wherein an interface between the first electrode layer and the first semiconductor layer or between the first electrode layer and the second semiconductor layer includes a dopant, and wherein the first electrode layer is made of at least one metal or an alloy selected from the group consisting of Au, Ag, Al, Zn, Zr, Pt, Rh, Ni, Pd, Cu, Sn, C, Mg, Cr, Te, Se and Ti.

2. The device according to claim 1, wherein the metal portion is made of a material having a reflectance of not less than 70 percent with respect to the center wavelength.

3. The device according to claim 1, wherein the first electrode layer has a size of not less than 300 micrometers square as viewed from the direction.

4. The device according to claim 1, wherein the first semiconductor layer includes a cladding layer.

5. The device according to claim 4, wherein the cladding layer is formed on a GaAs substrate.

6. The device according to claim 1, wherein the second semiconductor layer includes a cladding layer.

7. The device according to claim 1, wherein the second semiconductor layer includes a current diffusion layer.

8. The device according to claim 1, wherein the second semiconductor layer includes a contact layer.

9. The device according to claim 1, wherein the first semiconductor layer, the light emitting layer, and the second semiconductor layer constitute a heterostructure.

10. The device according to claim 1, wherein the light emitting layer includes InGaP.

11. The device according to claim 1, wherein the light emitting layer has a MQW (Multiple Quantum Well) structure, barrier layers and well layers being alternately and repeatedly provided in the MQW structure.

12. The device according to claim 1, wherein the light emitting device has a SQW (Single Quantum Well) structure, a pair of barrier layers being provided to sandwich a well layer in the SQW structure.

13. The device according to claim 1, wherein the dopant is zinc.

* * * * *